United States Patent
Moll et al.

(10) Patent No.: US 9,141,556 B2
(45) Date of Patent: Sep. 22, 2015

(54) SYSTEM TRANSLATION LOOK-ASIDE BUFFER WITH REQUEST-BASED ALLOCATION AND PREFETCHING

(71) Applicant: QUALCOMM TECHNOLOGIES, INC., San Diego, CA (US)

(72) Inventors: Laurent Moll, San Jose, CA (US); Jean-Jacques LeCler, Antibes (FR); Philippe Boucard, Le Chesnay (FR)

(73) Assignee: Qualcomm Technologies, Inc., San Diego, CA (US)

( * ) Notice: Subject to any disclaimer, the term of this patent is extended or adjusted under 35 U.S.C. 154(b) by 104 days.

(21) Appl. No.: 13/969,425

(22) Filed: Aug. 16, 2013

(65) Prior Publication Data

US 2014/0052954 A1 Feb. 20, 2014

Related U.S. Application Data (60) Provisional application No. 61/684,705, filed on Aug. 18, 2012.

(51) Int. Cl.
```
G06F 12/00      (2006.01)
G06F 12/10      (2006.01)
G06F 12/08      (2006.01)
G06F 17/50      (2006.01)
G06F 12/02      (2006.01)
```

(52) U.S. Cl.
CPC ........ G06F 12/1036 (2013.01); G06F 12/0207 (2013.01); G06F 12/0215 (2013.01); G06F 12/0811 (2013.01); G06F 12/1027 (2013.01); G06F 12/1081 (2013.01); G06F 17/5009 (2013.01); *G06F 2212/681* (2013.01)

(58) Field of Classification Search
CPC ..... G06F 12/00; G06F 12/10; G06F 12/1009; G06F 12/063
USPC .................. 711/100, 154, 200, 205
See application file for complete search history.

(56) References Cited

U.S. PATENT DOCUMENTS

| | | | |
|---|---|---|---|
| 4,525,780 A | | 6/1985 | Bratt et al. |
| 4,914,577 A | * | 4/1990 | Stewart et al. ................ 711/207 |
| 5,598,553 A | | 1/1997 | Richter et al. |

(Continued)

FOREIGN PATENT DOCUMENTS

| | | |
|---|---|---|
| EP | 0495167 A2 | 7/1992 |
| EP | 0518575 A1 | 12/1992 |

(Continued)

OTHER PUBLICATIONS

Altera, "SOPC Builder User Guide", Dec. 2010, chapter 11, pp. 1-25. [retrieved May 14, 2014]. Retrieved from the Internet: <URL: http://www.altera.com/literature/ug/ug_sopc_builder.pdf>.

(Continued)

*Primary Examiner* — Tuan Thai
(74) *Attorney, Agent, or Firm* — Muncy, Geissler, Olds & Lowe, P.C.

(57) ABSTRACT

A system TLB accepts translation prefetch requests from initiators. Misses generate external translation requests to a walker port. Attributes of the request such as ID, address, and class, as well as the state of the TLB affect the allocation policy of translations within multiple levels of translation tables. Translation tables are implemented with SRAM, and organized in groups.

37 Claims, 4 Drawing Sheets

(56) References Cited

U.S. PATENT DOCUMENTS

| | | |
|---|---|---|
| 5,701,448 A | 12/1997 | White |
| 5,752,274 A | 5/1998 | Garibay, Jr. et al. |
| 6,065,113 A | 5/2000 | Shiell et al. |
| 6,195,735 B1 * | 2/2001 | Krueger et al. ............... 711/204 |
| 6,212,603 B1 | 4/2001 | McInerney et al. |
| 6,289,138 B1 | 9/2001 | Yip et al. |
| 6,389,514 B1 | 5/2002 | Rokicki |
| 6,574,698 B1 | 6/2003 | Dhong et al. |
| 6,629,207 B1 | 9/2003 | Yoshioka et al. |
| 6,675,280 B2 | 1/2004 | Cooksey et al. |
| 7,099,318 B2 | 8/2006 | Harriman |
| 7,797,494 B2 | 9/2010 | Kimura |
| 7,962,715 B2 | 6/2011 | Ware |
| 8,095,931 B1 | 1/2012 | Chen et al. |
| 8,185,696 B2 * | 5/2012 | Vuletic et al. ................. 711/137 |
| 8,225,070 B2 | 7/2012 | Okawara et al. |
| 8,250,307 B2 | 8/2012 | Arimilli et al. |
| 2002/0038401 A1 | 3/2002 | Zaidi et al. |
| 2003/0126371 A1 | 7/2003 | Venkatraman |
| 2004/0034718 A1 * | 2/2004 | Goldenberg et al. ......... 709/250 |
| 2004/0176942 A1 | 9/2004 | Chochia et al. |
| 2004/0215649 A1 * | 10/2004 | Whalen et al. ................ 707/102 |
| 2004/0215849 A1 | 10/2004 | Graham et al. |
| 2007/0044106 A2 | 2/2007 | Kissell et al. |
| 2007/0067505 A1 * | 3/2007 | Kaniyur et al. ................. 710/22 |
| 2007/0092018 A1 | 4/2007 | Fonseka et al. |
| 2008/0209130 A1 * | 8/2008 | Kegel et al. ................... 711/135 |
| 2008/0209173 A1 | 8/2008 | Evers et al. |
| 2009/0019252 A1 * | 1/2009 | Burns et al. ................... 711/200 |
| 2009/0164998 A1 * | 6/2009 | Stevens et al. ................ 718/101 |
| 2009/0235278 A1 | 9/2009 | Prakash |
| 2010/0057997 A1 * | 3/2010 | Moyer .......................... 711/146 |
| 2010/0153686 A1 | 6/2010 | Frank |
| 2010/0262787 A1 * | 10/2010 | Arimilli et al. ............... 711/146 |
| 2010/0306503 A1 * | 12/2010 | Henry et al. .................. 712/207 |
| 2011/0010521 A1 * | 1/2011 | Wang et al. ................... 711/207 |
| 2011/0040941 A1 | 2/2011 | Diefendorff |
| 2011/0072235 A1 | 3/2011 | Deming et al. |
| 2011/0074802 A1 | 3/2011 | Nickolls et al. |
| 2011/0145542 A1 | 6/2011 | Morrow |
| 2011/0219208 A1 | 9/2011 | Asaad et al. |
| 2012/0011342 A1 | 1/2012 | Ingle et al. |
| 2012/0066455 A1 | 3/2012 | Punyamurtula et al. |
| 2012/0117301 A1 | 5/2012 | Wingard |
| 2012/0124260 A1 | 5/2012 | Kothamasu |
| 2014/0052919 A1 | 2/2014 | Moll et al. |
| 2014/0052955 A1 | 2/2014 | Moll et al. |
| 2014/0052956 A1 | 2/2014 | Moll |

FOREIGN PATENT DOCUMENTS

| | | |
|---|---|---|
| EP | 1031919 B1 | 10/2008 |
| WO | 2007079192 A2 | 7/2007 |

OTHER PUBLICATIONS

International Search Report and Written Opinion—PCT/US2013/055451—ISA/EPO—May 23, 2014.

* cited by examiner

SYSTEM TRANSLATION LOOK-ASIDE BUFFER WITH REQUEST-BASED ALLOCATION AND PREFETCHING

CROSS-REFERENCE AND RELATED APPLICATIONS

This application claims priority under 35 USC 119 from U.S. Provisional Application Ser. No. 61/684,705 filed on Aug. 18, 2012, titled SYSTEM TRANSLATION LOOK-ASIDE BUFFER WITH REQUEST-BASED ALLOCATION AND PREFETCHING, the entire disclosure of which is incorporated herein by reference.

FIELD OF THE INVENTION

The herein disclosed invention is in the field of computer system design, particularly for system-on-chip semiconductor devices.

BACKGROUND

Memory Management Units (MMUs) are commonly used in microprocessors to provide virtual memory capability. When virtual memory is enabled, software executing on the processor only sees and uses Virtual Addresses (VA). The MMU is tasked to convert a VA into a Physical Address (PA) that can then be used inside and outside the processor. Using virtual memory has a number of advantages including being able to give the illusion of more memory than is actually available, giving access to a physical memory system that has more address bits than are supported by the software, and protection of the physical memory with varying access rights.

Some modern systems that support virtualization have two levels of address translation between VAs and PAs. The first level is similar to that found on non-virtualized system, but the PA is not the final PA. It may be called Intermediate Physical Address (IPA) or Guest Physical Address (GPA). The second level maps that intermediate address into a final PA. In these systems, for any software running on the processor, the first level or the second level or both may be enabled.

In general, the virtual address space is divided into pages. Pages are commonly a few kilobytes, though other page sizes can be used. Systems often support multiple page sizes from a few kilobytes to a few megabytes or even gigabytes to increase translation efficiency. All addresses within a page are translated in the same fashion and all the access right information is the same. The translation between VAs and PAs is done through a (often multi-level) page table. The process of going through the page table to translate a VA into a PA is often called walking as it comprises a sequence of page table lookups.

The MMU often comprises two parts. The first part is called the Translation Look-aside Buffer (TLB). It caches translations so that they are very quickly accessible to the processor, so that for translations that are cached, the processor can execute with little delay. The second part is the walker, which walks the page tables when the TLB does not contain a translation. In some systems, there is more caching between the TLB and the walker. For instance, the TLB has 2 levels of caching. The walker itself can contain a cache.

A System MMU (SMMU) mirrors the functionality of an MMU, but applied to initiators other than microprocessors. Some such initiators are GPUs, DSPs, and DMA engines. With an SMMU, such initiators can take advantage of the benefits of virtual memory and virtualization. Like an MMU, an SMMU operates on pages and uses page tables to calculate translations. In some cases, an SMMU uses the same page table formats as the MMU of a processor to which the SMMU's initiator is connected. In that case, the page table can be shared between the MMU and the SMMU.

As an MMU comprises a TLB and a walker, so an SMMU comprise a System TLB (STLB) and a walker. The STLB acts as a cache for translations to help in keeping peak performance of initiators. In some cases, multiple STLBs can share a single walker for efficiency reasons. In some cases multiple initiators can share a STLB.

In most cases, TLBs inside processors are tightly integrated with the processor because physical addresses are needed inside the processor (e.g. for caches that are visible to cache coherency). In contrast, an STLB does not have to be integrated inside an initiator. It may be placed outside the initiator without any negative impact. In many cases, multiple initiators share a single STLB. An STLB just needs to be between the source and the destination of a request to provide translation services. Most chip designs have an interconnect that provides access by initiators to targets. STLBs may be placed between the initiators and the interconnect, or within the interconnect, close to the initiators.

The addition of virtual memory to an initiator can have severe negative effects on the performance of the initiator. In addition to the latency increase due to the extra logic, anytime the STLB misses (i.e. the translation necessary to process a request from the initiator is not cached) the request must be stalled until that translation has been resolved, either by another level of cache or a walk. This will impact the performance of the request and might also impact following requests. Since a page table walk typically takes between 1 and 20 sequential accesses and each access typically takes between 10 and 100 clock cycles, the initiator request might be stalled for a large amount of time and the performance of the initiator might be drastically reduced.

Reducing the STLB misses can be done by increasing the size of the STLB cache and by reducing the walk delay. However, this is insufficient. Some misses are compulsory misses (e.g. when a page is seen for the first time and the cache has no chance to already contain the translation) and these are not improved by the cache size. In some extreme examples, large amounts of data with poor page locality are requested by the initiator, triggering large numbers of compulsory misses.

Therefore, what is needed is a mechanism to prefetch translations into the STLB so that the probability of a request missing in the STLB is reduced or eliminated. This is particularly applicable to System TLBs because initiators tend to have predictable memory access patterns and in many cases can also be enhanced to generate advanced prefetch patterns that predict future memory access patterns.

SUMMARY OF THE INVENTION

The present invention is such a mechanism. Requests are input to an STLB. The request can be a normal request (a data read or write) or a prefetch. A prefetch is a request that does not cause data to be transferred between an initiator and a target. A prefetch causes an STLB to request a read of a translation from a page table in advance of when a translation is likely to be requested.

Note that an STLB prefetch is different from a CPU prefetch. A CPU prefetch is generally initiated by a particular instruction. A CPU prefetch moves data from memory into the CPU data or instruction cache so as to improve the probability of a CPU read hitting in the cache. An STLB prefetch moves a mapping from a page table in memory into the STLB translation table, which acts as a cache, in order to improve the probability of an initiator transaction request address translation hitting in the STLB translation cache. The remaining extent of this disclosure is concerned with STLB prefetches, and the term prefetch should be understood to mean such.

DETAILED DESCRIPTION

Figure 1:
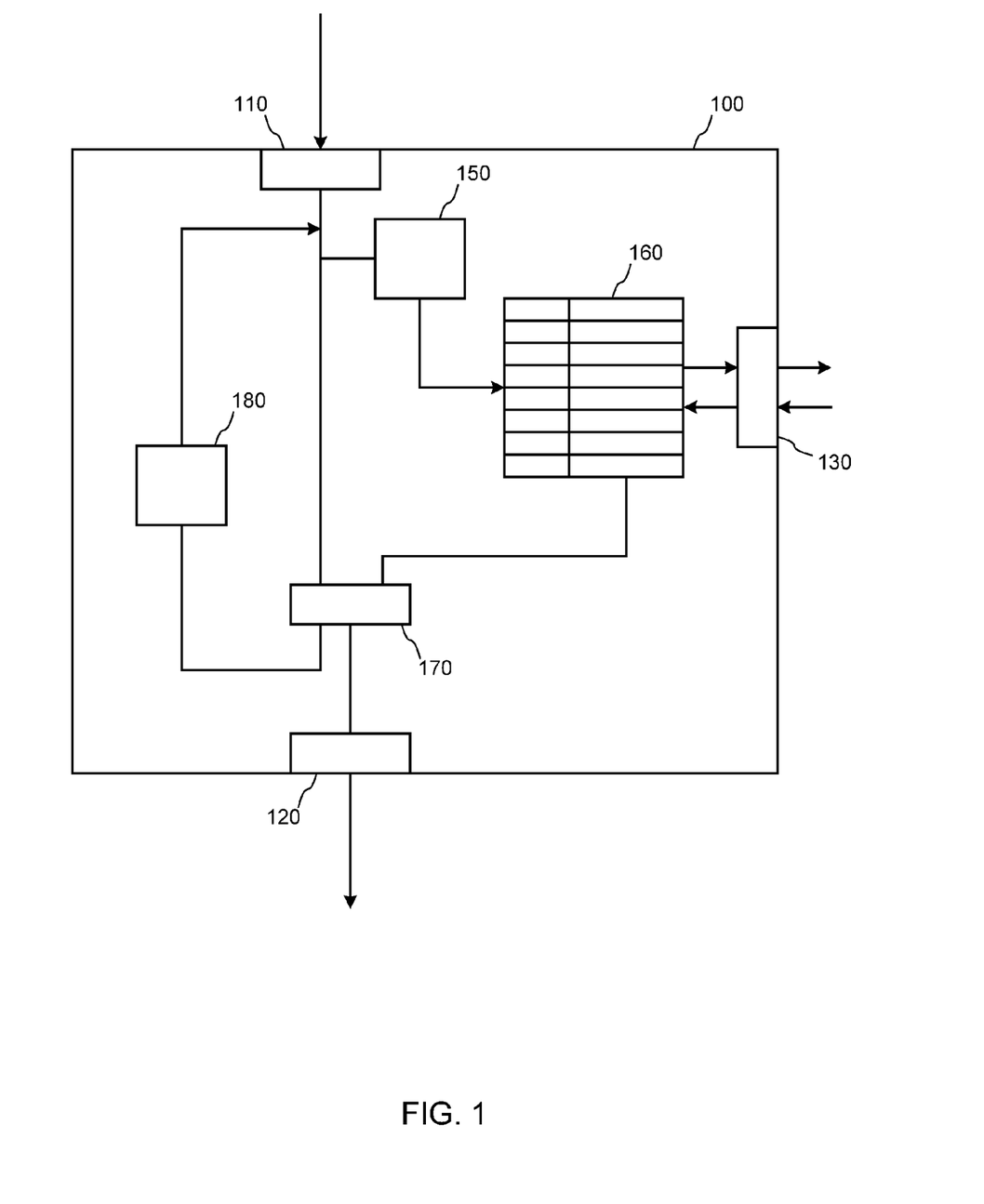
FIG. 1 illustrates a simple STLB in accordance with the various aspects of the present invention.

Referring now to FIG. 1, STLB 100 receives input requests through input port 110, translates the address, and transmits one or more corresponding output request through output port 120. The requests are sent to context logic 150, which extracts the portions of the request relevant to the translation, including, but not limited to the address, the operation (read/write), the size, the security indication, the privilege level and generic side-band information. Using these portions, the context logic creates a combination of at least a context identifier and an address, which are looked up in a translation table 160.

The translation table 160 includes one or more entries, each corresponding to a range of addresses and a set of contexts. When the input request address and context match an entry, the translation table returns a number of parameters including the translated address and permissions. The translation table 160 can be implemented in many ways, such as in the form of a Content-Addressable Memory (CAM), either fully associative or set-associative. According to some aspects, STLB 100 includes multiple levels of translation table arranged in the manner of a multi-level cache, with a smaller number of entry, but lower latency translation table first, then a larger but higher latency translation table second.

Based on the context calculation done in the context logic 150 and the result of the translation table lookup of the translation table 160, control logic 170 takes one of the following actions:

A) If the context logic 150, using information from the request and some internal configuration state, determines that the request does not need translation, it is allowed to pass through with no or little modification, and the translation table 160 is not interrogated.

B) If the lookup hits in the translation table 160 and permissions are valid, the request is translated. At least the address field is modified to use the translated address. Typically, the most significant bits are replaced by the translated address obtained from the translation table 160, where the number of bits is derived from the page size corresponding to the entry in the translation table 160. In some cases other attributes of the request are also modified.

C) If the permission fails, the request is not allowed to proceed or is marked with an error.

D) If the lookup misses in the translation table 160 (i.e. there is no corresponding entry), the request does not proceed until the STLB 100 has placed an external translation request through a walker port 130 and has received a response from that same walker port 130. While the external translation request is pending, the original request is stalled in the STLB 100. That stalls all traffic going through the STLB 100. Some STLBs have a buffer 180 used to temporarily store requests that have missed in the TLB. It is usually referred to as a Hit-Under-Miss (HUM) and/or Miss-Under-Miss (MUM) buffer as it allows later requests to keep going through the STLB 100 (until the buffer 180 is full). After the external translation request through the walker port 130 has received a response, the stalled request is translated and handled according to A), B), or C).

In the case where an external translation request is sent through the walker port 130, when the response comes back, the new translation is added to the translation table 160. There are many sorts of algorithms that can be used to choose an entry in which to put the new translation (and from which to discard the previously stored translation). This includes common cache allocation replacement policies like Least Recently Used (LRU), Pseudo-LRU, Not-recently-Used (NRU), First-In-First-Out (FIFO), among others.

According to some aspects of the invention, external translation requests include a type. The type indicates whether the external translation request was initiated in response to a normal input request or a prefetch request. According to some aspects of the invention, the type is encoded in-band within the protocol of the walker port 130. According to other aspects of the invention, the type is indicated by a sideband signal.

According to some aspects of the invention, the translation table 160 is fully associative. According to some aspects of this invention, the translation table 160 is set-associative. According to some aspects of this invention, the translation table 160 is built of multiple levels of translation table. According to some aspects of this invention, the translation table 160 is built of a fist-level fully associative translation table and a second-level fully-associative or set-associative translation table. According to some aspects of this invention, part of the translation table 160 is built of one or more static random access memory (SRAM) arrays.

Figure 2:
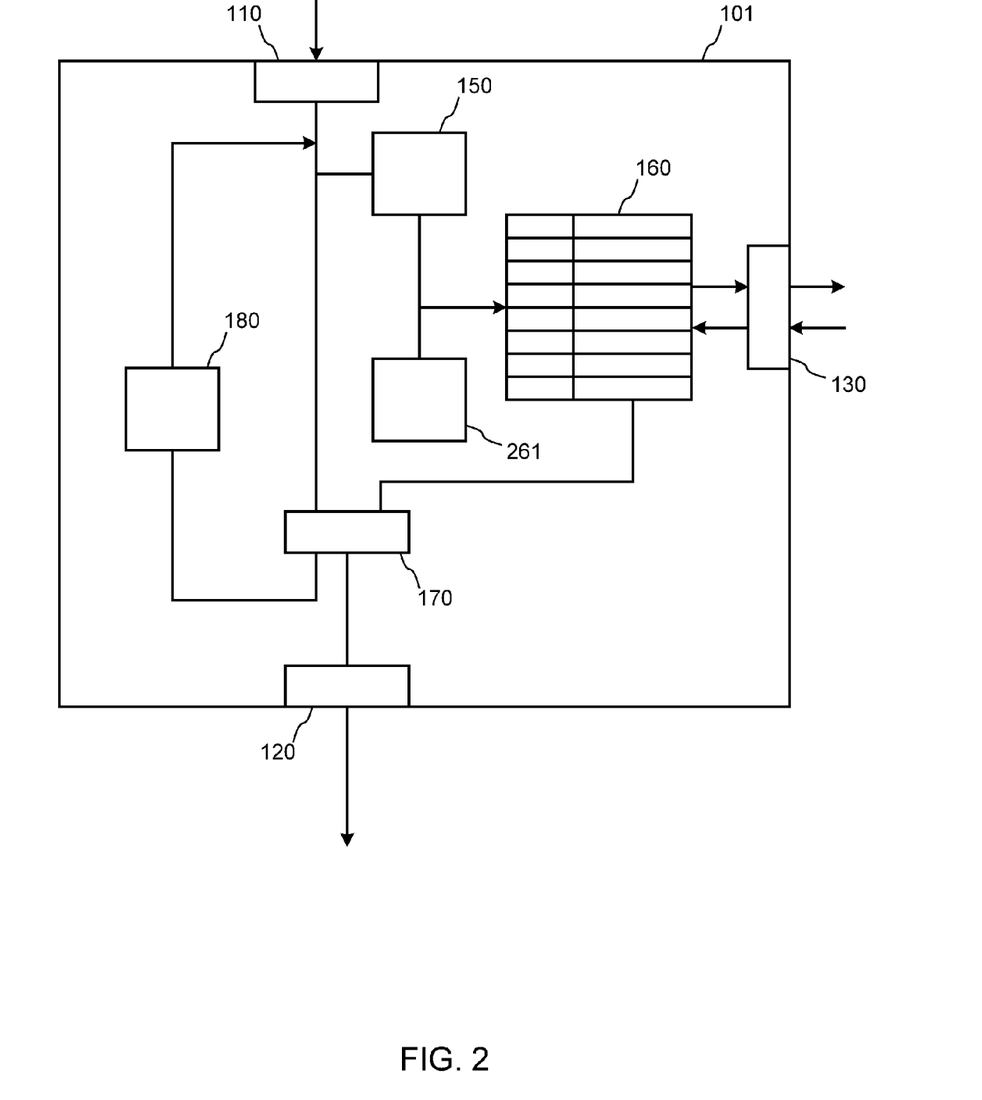
FIG. 2 illustrates a STLB with allocation logic in accordance with the various aspects of the present invention.

Referring now to FIG. 2, according to this invention, allocation logic 261 uses some characteristics of the request coming from the input port 110 to decide, based on a replacement policy, whether an entry should be allocated for the request in the translation table 160, and if so, which entry should be used. According to some aspects of the invention, the replacement policy can be changed on the fly. According to another aspect of the invention, the replacement policy is chosen on a per-transaction basis, as indicated by the transaction request.

According to some aspects of this invention, the translation table 160 is set associative and is split into multiple groups, each group containing one or more ways. According to some aspects of the invention, groups are just one entry. According to other aspects of the invention, groups are relatively larger and stored in SRAMs.

According to some aspects of this invention, attributes of the request coming from the input port 110 are used to determine the groups into which the request allocates an entry. Such attributes include the source of the request, the identifier (ID) of the request (sometimes referred to as the tag), or special sidebands dedicated to allocation, or any combination of these.

According to some aspects of this invention, the allocation logic 261 comprises a configurable or programmable register array used to determine the allowable allocation groups based on the attributes of the request used for the determination. A configurable array is set up at system hardware design time. A programmable array is set up by software, and may be changed during the running of a chip.

According to some aspects of this invention, classes of requests are determined using the attributes of the requests. According to some aspects of this invention, one class allocates a maximum number of entries in the translation table 160. According to some aspects of this invention, one class allocates a minimum number of entries in the translation table 160.

According to some aspects of the invention, if the number of pending requests to the walker (through walker port 130) is limited, the pending request entries are allocated in groups of the number of entries used, regulated by class. An external translation request made while a limit on the number of pending requests is reached causes the external translation request to be temporarily blocked until a response brings the number of pending external translation requests back below the limit. According to other aspects of the invention, the limit is applied to all pending external translation requests of a type that are the result of a prefetch input request. According to other aspects of the invention, the limit is applied to all pending external translation requests of a particular group. According to other aspects of the invention, the limit is applied to all pending external translation requests of a particular class.

According to an aspect of the invention, when the number of pending requests to the walker reaches a limit, requests resulting from prefetches are temporarily blocked until the number of pending requests is less than the limit. According to another aspect of the invention, when the number of pending requests to the walker reaches a limit, requests resulting from prefetches are discarded.

Figure 3:
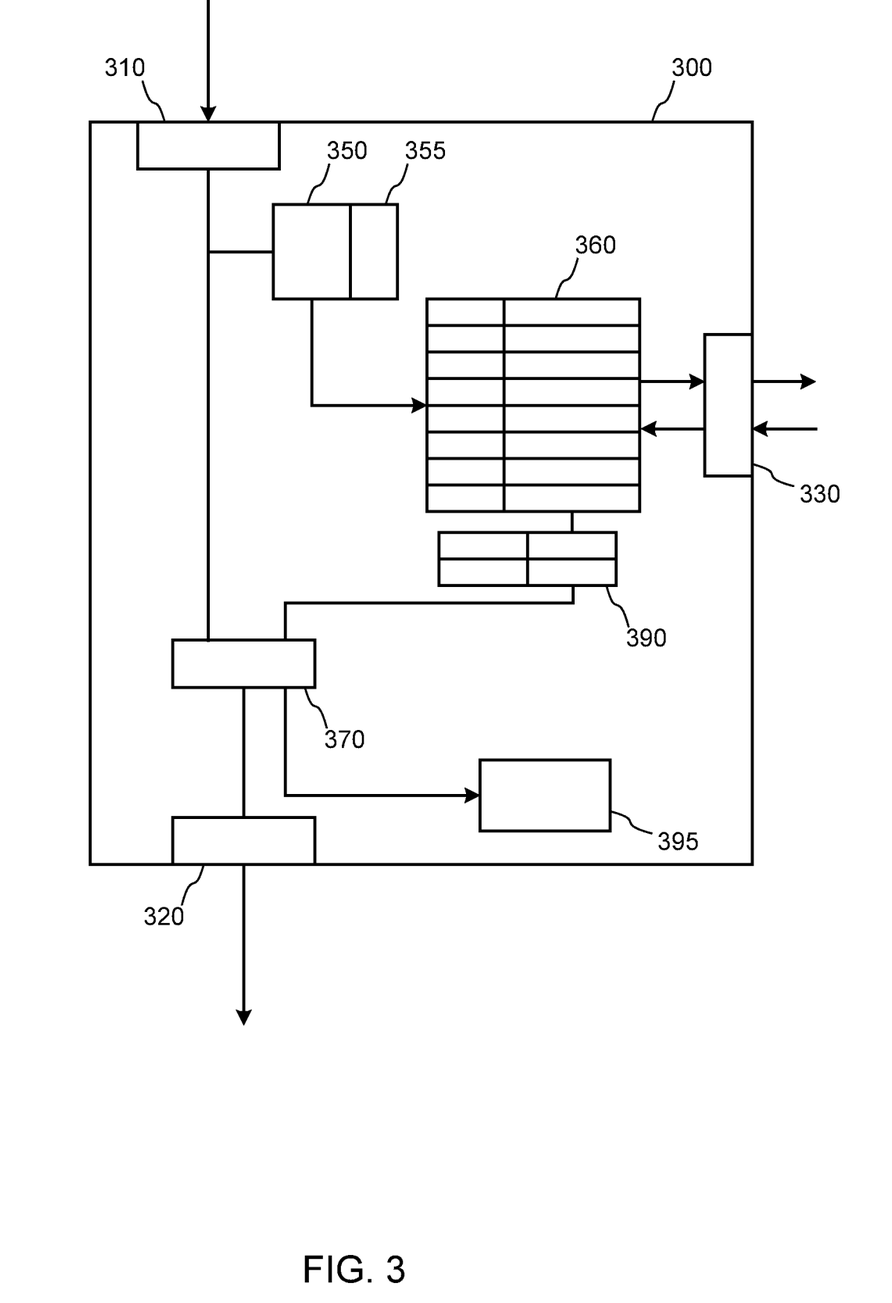
FIG. 3 illustrates a STLB that performs explicit prefetching in accordance with the various aspects of the present invention.

Referring now to FIG. 3, additional functionality supports explicit prefetching. According to an aspect of the invention, prefetch identification logic 355 identifies prefetch requests. Prefetch requests are identified using a variety of attributes. According to some aspects of this invention, prefetch requests are identified using a sideband signal that is also sent through input port 310 with the requests. According to other aspects of this invention, prefetch requests are identified using the ID of the request. According to other aspects of this invention, prefetch requests are identified using address bits of the requests. Other fields or combination of fields are used to identify prefetch requests. According to other aspects of the invention, prefetch requests have a dedicated prefetch port that is separate from input port 310.

According to some aspects of this invention, the prefetch requests are legally formed according to a standard transaction protocol in use. Some standard transaction protocols are the Advanced Microcontroller Bus Architecture (AMBA) Advanced eXtensible Interface (AXI) and Open Cores Protocol (OCP). According to some aspects of this invention, whereas normal requests are for a full cache line, prefetch requests are for a small data quantity like zero bytes or one byte. A zero byte request is illegal according to some protocols, but might be used as an indication of a prefetch. A one byte request is legal according to most protocols, and can be used as a prefetch size. A one byte request, a byte being a minimum atomic unit of data request, has the benefit of ensuring the requested data will not cross any boundaries between defined address ranges or cadences of access restrictions such as a page size aligned ranges. Furthermore, a one byte request requires exactly one cycle of data transfer on an interface. Alternatively, input requests can be forced to be page aligned, such as by discarding lower address bits. According to some aspects of this invention, the prefetch requests must contain no data. According to some aspects of this invention, the prefetch request must be aligned to a certain boundary, like 4 KB. According to other aspects of the invention, the prefetch requests take special forms not anticipated by the protocol. According to some aspects of the invention, prefetch request ID must be different from the ID of normal requests. According to some aspects of the invention, pending prefetch requests must all have different ID. According to some aspects of this invention, prefetch identification logic 355 is integrated in context logic 350.

According to some aspects of this invention, prefetch requests are also sent to a walker through port 330. According to some aspects of this invention, the request protocol used on the port 330 comprises a prefetch indication that makes the walker behave differently in certain cases. According to some aspects of this invention, when a request is identified as a prefetch request, it is considered speculative by the walker and no side effect, such as interrupts, are triggered. According to some aspects of the invention, the response protocol on the port 330 comprises an indication that the request would normally have triggered a side effect in the walker if it hadn't been a prefetch. According to some aspects of this invention, this response indication is used in the STLB 300 to not add a corresponding entry in a translation table 360 or a prefetch table 390. According to other aspects of this invention, the response indication is used to specially mark an entry in the translation table 360 or the prefetch table 390 so that when a non-prefetch request matches this entry, a new request is sent to the walker through port 330 with the prefetch indication disabled.

According to some aspects of this invention, the prefetch table 390 is used to store pending prefetch requests. According to some aspects of this invention, prefetch table 390 can contain prefetch requests that have not been sent to the walker. According to other aspects of the invention, the prefetch table 390 can contain prefetch requests that have been sent to the walker through port 330. According to other aspects of the invention, the prefetch table 390 can contain prefetch requests that have been sent to the walker through port 330 and have received a response through the walker through port 330. According to some aspects of the invention, when a response to a prefetch request is received by the STLB 300, the response translation is allocated in the translation table 360.

In addition to the four possible actions described in FIG. 1 for control logic 170 (A, B, C, D), according to the various aspects of the invention, a control logic 370 is also enabled to send a request identified as a prefetch request to the prefetch request termination logic 395. According to some aspects of this invention, the prefetch request termination logic 395 automatically responds to prefetch requests without sending them through a port 320. According to some aspects of the invention, prefetch request termination logic 395 responds to prefetch requests that miss in the translation table 360 only after they have received a response from the walker (through communication through port 330). Prefetch requests that hit in translation table 360 are responded to promptly by prefetch request termination logic 395. According to some aspects of this invention, prefetch request termination logic 395 responds right away to prefetch requests matching the page of a prefetch request that is pending. This way, an agent using STLB 300 connected through input port 310 keeps track of the number of pending prefetch requests and makes sure it does not send more prefetch requests than can be tracked by STLB 300. According to some aspects of this invention, when a prefetch request is received, but the prefetch table 390 does not have an entry available, the prefetch request does not trigger a request to the walker through port 330, but is instead responded to by prefetch request termination logic 395 right away. According to some aspects of this invention, when a prefetch request is received, but the prefetch table 390 does not have an entry available, it is stalled until space becomes available in prefetch table 390. According to some aspects of this invention, the selection between the above two behaviors (ignoring, stalling) is done by an indication in the prefetch request. According to other aspects of the invention, the selection is done by a configuration bit.

According to some aspects of the invention, STLB 300 includes allocation logic as described in FIG. 3. The allocation of prefetch table 390 comprises groups or the number of entries regulated by class. In addition, the prefetch indication is also used to determine the allowable allocation groups in the translation table 360 and prefetch table 390.

According to some aspects of the invention, if the number of pending requests to the walker (through port 330) is limited, the pending request entries are allocated in groups or the number of entries used regulated by class, with the prefetch indication of the request on input port 310 being used in the group or class determination.

According to some aspects of the invention, a separate port is provided for prefetch requests. In this case, prefetch request don't need to be differentiated from normal requests. However, according to some aspects they are still required to be of certain ID, size, and alignment.

According to some aspects of the invention, STLB 300 includes logic that automatically generates prefetches based on patterns observed on the input port 310. According to some aspects of the invention, the automatic prefetching is automatically prefetching the following page (based on a page size, including the current page size, a programmed page size or the minimum page size). According to some aspects of this invention, the automatic prefetching logic detects strides or 2-dimensional accesses and prefetch accordingly. Other common prefetching techniques can be used, but they are adapted to the page-granularity and avoid making multiple automatic prefetches to the same page. According to some aspects of the invention, prefetches sent to the walker through port 330 coming from the automatic prefetching logic use the speculative indication to prevent the walker from enabling side effects of the walk, such as interrupts.

Figure 4:
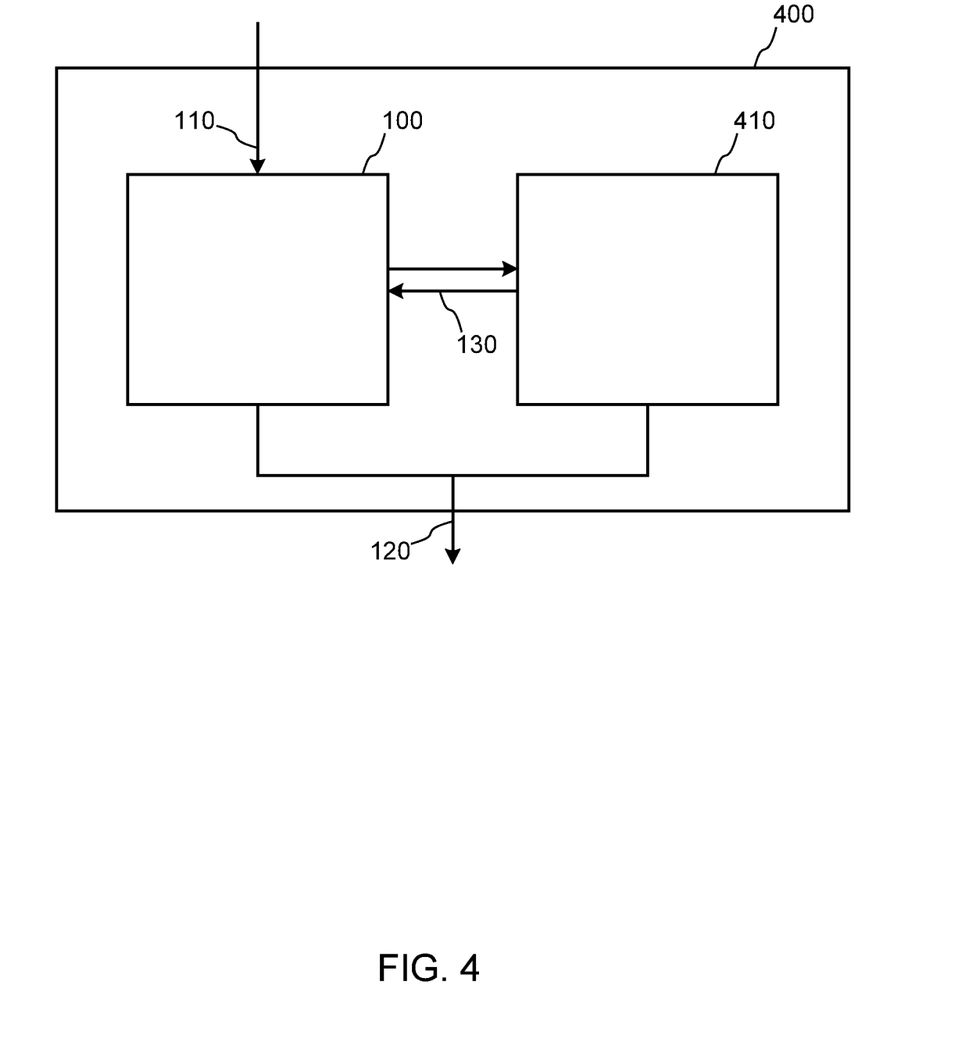
FIG. 4 illustrated a SMMU comprising an STLB and a walker in accordance with the various aspects of the present invention.

Referring now to FIG. 4, according to some aspects of this invention, STLB 100 is contained within SMMU 400. STLB 100 is coupled to walker 410. Walker 410 receives external translation requests from STLB 100, and provides responses through walker port 130. STLB 100 and walker 410 share output port 120.

As will be apparent to those of skill in the art upon reading this disclosure, each of the aspects described and illustrated herein has discrete components and features which may be readily separated from or combined with the features and aspects to form embodiments, without departing from the scope or spirit of the present invention. Any recited method can be carried out in the order of events recited or in any other order which is logically possible.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, representative illustrative methods and materials are now described.

All publications and patents cited in this specification are herein incorporated by reference as if each individual publication or patent were specifically and individually indicated to be incorporated by reference and are incorporated herein by reference to disclose and describe the methods and/or system in connection with which the publications are cited. The citation of any publication is for its disclosure prior to the filing date and should not be construed as an admission that the present invention is not entitled to antedate such publication by virtue of prior invention. Further, the dates of publication provided may be different from the actual publication dates which may need to be independently confirmed.

Additionally, it is intended that such equivalents include both currently known equivalents and equivalents developed in the future, i.e., any elements developed that perform the same function, regardless of structure. The scope of the present invention, therefore, is not intended to be limited to the exemplary embodiments shown and described herein.

In accordance with the teaching of the present invention a computer and a computing device are articles of manufacture. Other examples of an article of manufacture include: an electronic component residing on a mother board, a server, a mainframe computer, or other special purpose computer each having one or more processors (e.g., a Central Processing Unit, a Graphical Processing Unit, or a microprocessor) that is configured to execute a computer readable program code (e.g., an algorithm, hardware, firmware, and/or software) to receive data, transmit data, store data, or perform methods.

The article of manufacture (e.g., computer or computing device) includes a non-transitory computer readable medium or storage that includes a series of instructions, such as computer readable program steps or code encoded therein. In certain aspects of the present invention, the non-transitory computer readable medium includes one or more data repositories. Thus, in certain embodiments that are in accordance with any aspect of the present invention, computer readable program code (or code) is encoded in a non-transitory computer readable medium of the computing device. The processor, in turn, executes the computer readable program code to create or amend an existing computer-aided design using a tool. In other aspects of the embodiments, the creation or amendment of the computer-aided design is implemented as a web-based software application in which portions of the data related to the computer-aided design or the tool or the computer readable program code are received or transmitted to a computing device of a host.

An article of manufacture or system, in accordance with various aspects of the present invention, is implemented in a variety of ways: with one or more distinct processors or microprocessors, volatile and/or non-volatile memory and peripherals or peripheral controllers; with an integrated microcontroller, which has a processor, local volatile and non-volatile memory, peripherals and input/output pins; discrete logic which implements a fixed version of the article of manufacture or system; and programmable logic which implements a version of the article of manufacture or system which can be reprogrammed either through a local or remote interface. Such logic could implement either a control system either in logic or via a set of commands executed by a soft-processor.

Accordingly, the preceding merely illustrates the various aspects and principles of the present invention. It will be appreciated that those skilled in the art will be able to devise various arrangements which, although not explicitly described or shown herein, embody the principles of the invention and are included within its spirit and scope. Furthermore, all examples and conditional language recited herein are principally intended to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention as well as specific examples thereof, are intended to encompass both structural and functional equivalents thereof. Additionally, it is intended that such equivalents include both currently known equivalents and equivalents developed in the future, i.e., any elements developed that perform the same function, regardless of structure. The scope of the present invention, therefore, is not intended to be limited to the various aspects discussed and described herein. Rather, the scope and spirit of present invention is embodied by the appended claims.

What is claimed is:

1. A system translation look-aside buffer comprising:
a translation table that stores address translations;
an input port enabled to receive an input request from an initiator; and
an output port enabled to send an output request corresponding to the input request,
wherein if the input request is a prefetch then the output port does not send an output request,
wherein the translation table returns a translated address if the input request matches an entry in the translation table,
wherein an address field is modified to use the translated address,
wherein at least some bits of the address field are replaced by the translated address obtained from the translation table, and
wherein the number of bits of the address field replaced by the translated address is derived from the page size corresponding to the entry in the translation table.

2. The system translation look-aside buffer of claim 1 further comprising a prefetch port dedicated to receiving prefetch requests.

3. The system translation look-aside buffer of claim 1 further comprising a sideband signal that indicates whether the input request is a prefetch.

4. The system translation look-aside buffer of claim 1 wherein the input request comprises an ID that indicates a value, the value indicating whether the input request is a prefetch.

5. The system translation look-aside buffer of claim 1 wherein the input request comprises an address, the address indicating whether the input request is a prefetch.

6. The system translation look-aside buffer of claim 1 wherein the input request is made in compliance with a standard transaction protocol whether or not it is a prefetch.

7. The system translation look-aside buffer of claim 1 wherein the input request comprises a size that indicates a quantity of data requested by the input request, and wherein the size can indicate a quantity of data that is less than the size of a full cache line.

8. The system translation look-aside buffer of claim 7 wherein the size is zero.

9. The system translation look-aside buffer of claim 7 wherein the size is one byte.

10. The system translation look-aside buffer of claim 1 wherein the input request is page aligned.

11. The system translation look-aside buffer of claim 1 wherein the translation table is set associative.

12. The system translation look-aside buffer of claim 11 wherein the translation table comprises a static random access memory array.

13. The system translation look-aside buffer of claim 1 further comprising a second translation table.

14. The system translation look-aside buffer of claim 1 further comprising allocation logic arranged to use either a first replacement policy or a second replacement policy.

15. The system translation look-aside buffer of claim 14 wherein the replacement policy used can be changed on the fly.

16. The system translation look-aside buffer of claim 14 wherein the replacement policy for a given request is based on an attribute of the input request.

17. The system translation look-aside buffer of claim 1 wherein the translation table comprises a first group and a second group.

18. The system translation look-aside buffer of claim 17 further comprising a configurable register array that determines whether allocation is allowed in the first group.

19. The system translation look-aside buffer of claim 17 further comprising a programmable register array that determines whether allocation is allowed in the first group.

20. The system translation look-aside buffer of claim 17 wherein an attribute of the input request determines whether the input request allocates an entry in the first group.

21. The system translation look-aside buffer of claim 20 wherein the attribute is an indication of a source of the input request.

22. The system translation look-aside buffer of claim 20 wherein the attribute is an identifier.

23. The system translation look-aside buffer of claim 20 wherein the attribute is a sideband.

24. The system translation look-aside buffer of claim 1 wherein:
the input request comprises an input request class; and
the translation table comprises a multiplicity of translation table entries, each of which comprises an entry class.

25. The system translation look-aside buffer of claim 24 wherein, if the number of translation table entries with an entry class matching the input request class exceeds a maximum number then the system translation look-aside buffer replaces a translation table entry that has an entry class matching the input request class.

26. The system translation look-aside buffer of claim 24 wherein, if the number of translation table entries having a particular entry class falls below a minimum number then translation table entries having the particular entry class are ineligible to be replaced.

27. The system translation look-aside buffer of claim 1 further comprising a walker port for sending external translation requests,
the input request comprising an address,
wherein if the translation table indicates a miss, the system translation look-aside buffer sends an external translation request.

28. The system translation look-aside buffer of claim 27 further comprising an external translation request type wherein the external translation request type indicates whether the input request is a prefetch.

29. The system translation look-aside buffer of claim 27 wherein the sending of the external translation request is temporarily blocked when the number of pending external translation requests reaches a limit.

30. The system translation look-aside buffer of claim 27 wherein the sending of the external translation request is temporarily blocked when the number of pending external translation requests due to prefetches reaches a limit.

31. The system translation look-aside buffer of claim 27 wherein the sending of the external translation request is discarded when the number of pending external translation requests due to prefetches reaches a limit.

32. The system translation look-aside buffer of claim 27 wherein:
- the translation table comprises a first group and a second group; and
- the sending of the an external translation request is temporarily blocked when the number of pending external translation requests to the first group reaches a limit.

33. The system translation look-aside buffer of claim 27 wherein:
- the input request comprises a class;
- the class is associated with the external translation request; and
- the sending of the external translation request is temporarily blocked when the number of pending external translation requests of the class reaches a limit.

34. A system memory management unit comprising:
- a walker;
- a system translation look-aside buffer comprising:
  - a translation table that stores address translations;
  - an input port enabled to receive an input request from an initiator, the input request comprising an address, wherein if the translation table indicates a miss, the buffer sends an external translation request; and
  - an output port enabled to send an output request corresponding to the input request,
  - wherein if the input request is a prefetch then the output port does not send an output request,
  - wherein the translation table returns a translated address if the input request matches an entry in the translation table,
  - wherein an address field is modified to use the translated address,
  - wherein at least some bits of the address field are replaced by the translated address obtained from the translation table, and
  - wherein the number of bits of the address field replaced by the translated address is derived from the page size corresponding to the entry in the translation table, and
- wherein the system translation look-aside buffer is coupled with the walker.

35. The system memory management unit of claim 34 further comprising an external translation request type that indicates whether the input request is a prefetch.

36. The system memory management unit of claim 35 wherein when the external translation request type indicates that the input request is a prefetch, the system memory management unit is prevented from generating side effects.

37. An interconnect comprising:
- an initiator;
- a target;
- a walker;
- a system translation look-aside buffer comprising:
  - a translation table that stores address translations;
  - an input port enabled to receive an input request from an initiator, the input request comprising an address, wherein if the translation table indicates a miss, the buffer sends an external translation request;
  - an output port enabled to send an output request corresponding to the input request,
    - wherein if the input request is a prefetch then the output port does not send an output request,
  - wherein the translation table returns a translated address if the input request matches an entry in the translation table,
  - wherein an address field is modified to use the translated address,
  - wherein at least some bits of the address field are replaced by the translated address obtained from the translation table, and
  - wherein the number of bits of the address field replaced by the translated address is derived from the page size corresponding to the entry in the translation table; and
- a walker port for sending external translation requests, wherein the sending of the external translation request is discarded when the number of pending external translation requests due to prefetches reaches a limit, and
- the input port of the system translation look-aside buffer is accessible by the initiator, the target is accessible by the output port of the system translation look-aside buffer, and the walker is accessible by the walker port of the system translation look-aside buffer.

* * * * *